United States Patent [19]

Fumery

[11] Patent Number: 5,357,151
[45] Date of Patent: Oct. 18, 1994

[54] INTRINSICALLY SAFE LOGIC AND-CIRCUIT HAVING TWO INPUTS

[75] Inventor: Benoît Fumery, Montrouge Cedex, France

[73] Assignee: Matra Transport, France

[21] Appl. No.: 83,434

[22] Filed: Jun. 29, 1993

[30] Foreign Application Priority Data

Sep. 2, 1992 [FR] France .................. 92 10484

[51] Int. Cl.⁵ .................. H03K 19/20; H03K 19/007
[52] U.S. Cl. .................. 307/442; 307/454
[58] Field of Search .................. 307/442, 454, 479

[56] References Cited

U.S. PATENT DOCUMENTS

| | | | |
|---|---|---|---|
| 4,723,082 | 2/1988 | Asano et al. | 307/451 |
| 4,972,517 | 11/1990 | Kondou et al. | 307/475 |
| 5,153,466 | 10/1992 | Stein et al. | 307/475 |

OTHER PUBLICATIONS

Electronique, "Designasafe Logic AND Gate", pp. 63-64 and 67-68, Nov. 12, 1991, Sardat.

*Primary Examiner*—Edward P. Westin
*Assistant Examiner*—Richard Roseen
*Attorney, Agent, or Firm*—Larson and Taylor

[57] ABSTRACT

A logic AND circuit comprises, in a cascade arrangement, a threshold oscillator having a power supply input connected to a first circuit input and a clamping amplifier providing an output signal only when simultaneously the voltage on a second circuit input exceeds a threshold and the threshold oscillator delivers an output signal. The oscillator comprises a single transistor whose emitter and collector circuits contain two primary windings of a transformer whose secondary winding constitutes a tuned circuit in association with a four-lead capacitor and whose base is biased from the first input via a filter cell having a parallel-connected four-lead capacitor. The clamping amplifier includes a single transistor connected to the second input via a filter cell having a parallel-connected four-lead capacitor, with one of its emitter and collector circuits containing the primary winding of another transformer whose secondary winding contains a resonant circuit with a parallel-connected four-lead capacitor from whose terminals an alternating output signal is taken.

5 Claims, 3 Drawing Sheets

INTRINSICALLY SAFE LOGIC AND-CIRCUIT HAVING TWO INPUTS

BACKGROUND OF THE INVENTION

The present invention relates to intrinsically safe logic AND circuits, i.e. circuits that are not liable to a failure leading to a logic level 1 at the output while one of the inputs is at a logic level 0 ( such a level 0 being indicated by an input voltage below a given threshold).

A particularly important, but not exclusive application of the invention lies in railway installations that may be designed so that the presence of such a zero level corresponds to a restriction of vehicle traffic over guiding tracks.

AND-circuits are already known that comprise, in cascade, a threshold oscillator that delivers an output signal only if the voltage on a power supply input (constitung a first input of the AND circuit) exceeds a determined threshold, and a peak-limiting amplifier that cannot provide an output signal exceeding a given value unless the voltage on its own power supply input (constituting the second input of the AND circuit) exceeds another threshold, said amplifier being designed so as to be unable to oscillate spontaneously.

The circuit is often completed with a rectifier for transforming the AC output signal representative of level 1 at the output from the implementing amplifier into a DC signal suitable for driving another AND circuit.

An impedance matching amplifier is generally also placed downstream from the peak-limiting amplifier and upstream from a possible rectifier.

It can be seen that such circuits operate with AC, thereby avoiding any risk of an output being directly fed through from an input as could happen in the event of DC operation. In general, coupling transformers are used between the various components since with appropriate installation such transformers completely block the passage of any DC signal. Such transformers may be associated with other kinds of impedance (capacitor and/or resistance) enabling a resonant circuit to be implemented. Any damping resistance must necessarily be connected in series so that in the event of a connection being broken there can be no increase in the output signal.

Existing logic AND circuits of the above-defined type suffer from various drawbacks and limitations. In particular, they are expensive since they require a large number of components and they require a metal screeming box for protection against electromagnetic interference. They are sensitive to alternating input signals in common mode that could induce an output signal in the absence of a ground node to which all of the components are connected. The screening box presents an antenna effect.

SUMMARY OF THE INVENTION

It is an object of the invention to provide a logic AND circuit that satisfies practical requirements better than do previously known circuits. A particular object is to provide a circuit having low sensitivity to alternating input signals in common mode, thereby enabling "floating modes" to be used, and low sensitivity to electromagnetic noise, thereby avoiding the need to use a metal screening box.

To this end, the invention provides, in particular, an AND-circuit of the hereinbefore defined type, wherein the oscillator, which is of the type using variation of the dynamic impedance of the emitter of a transistor, comprises a single transistor whose emitter and collector circuits contain the two primary windings of a transformer whose secondary winding constitutes a tuned circuit in association with a four-lead capacitor and whose base is biased from the first input via a filter cell having a parallel-connected four-lead capacitor, so connected that the input current flows across the plates of the capacitor; the peak-limiting amplifier includes a single transistor connected to the second input via a filter cell having a parallel-connected four-lead capacitor, with one of its emitter and collector circuits containing the primary winding of a transformer whose secondary winding contains a resonant circuit with a parallel-connected four-lead capacitor from whose terminals the alternating output signal is taken.

It can be seen that the resonating tuned circuits have an impedance that may be referred to as a "controlled impedance" in that the ratio between the output voltage and the input current flowing through the primary winding cannot increase in the event of a failure; this controlled nature of the impedance also gives a controlled gain to the amplifier, thereby eliminating any risk of spontaneous oscillation of the peak-limiting amplifier. The filtering cells interposed in the two inputs also present intrinsic safety since a break in a conductor cannot give rise to an increase in the output signal. On the other hand, such an increase is to be feared in the event of an open-circuit with a conventional capacitor.

In general, the peak-limiting amplifier will have a bipolar transistor connected in common emitter mode that enables a higher voltage gain to be obtained than can be obtained in common collector mode. Nevertheless, current collector mode can be used, particularly when the peak-limiting amplifier is followed with an impedance-lowering amplifier, as is often the case.

An output amplifier is necessary, in particular, whenever it is desired to feed a new AND gate since it is then necessary to reduce the output impedance of the circuit to a value much lower than that of the peak-limiting amplifier. Its gain will generally be close to unity, so as to make it aperiodic.

Finally, the rectifier or rectifiers required for reconstituting a DC signal from the AC output include a four-lead filter capacitor so as to make the rectifier secure. The rectifier may be conventionally designed, but it is nevertheless generally advantageous to use a so-called "diode pump" circuit having two diodes that enable voltage doubling.

The invention will be better understood from the following description of a circuit constituting a particular embodiment and given by way of non-limiting examples.

DETAILED DESCRIPTION OF EMBODIMENTS

The circuit described below uses PNP-type bipolar transistors. However, it would be equally possible to use NPN-type transistors, or even MOS transistors (except for the oscillator stage).

The circuit may be thought of as comprising a cascade connection of a threshold oscillator, a peak-limiting amplifier, an impedance lowering amplifier, and a set of rectifiers enabling signals to be applied to further AND gates.

The above components will be described in succession.

Threshold Oscillator

The threshold oscillator 10 is constituted by a circuit having a single transistor 12 and designed so as to be unable to oscillate so long as the DC power supply voltage E1 applied to its input terminals 1 and 2 remains below a threshold voltage, and to provide an AC signal at a predetermined high frequency (often 50 kHz or 100 kHz) whenever E1 exceeds the threshold voltage.

The physical phenomenon used for certaincy that no oscillation will take place at low values of the input voltage E1 is variation in the dynamic impedance of the emitter of transistor 12 as a function of the emitter current.

This impedance is equal to:

$$re = \frac{kT}{q} \cdot \frac{1}{Ie}$$

where
- re is the dynamic impedance of the emitter,
- k is Boltzmann's constant,
- T is absolute temperature,
- q is the charge of an electron; and
- Ie is the emitter current.

The emitter current Ie is made proportional to the power supply voltage E1 by the input resistance, and the oscillator circuit is such that its loop gain is proportional to the dynamic impedance re, thereby ensuring that the oscillation threshold is sharp and continues to be guaranteed for all kinds of failures.

Figure 1:
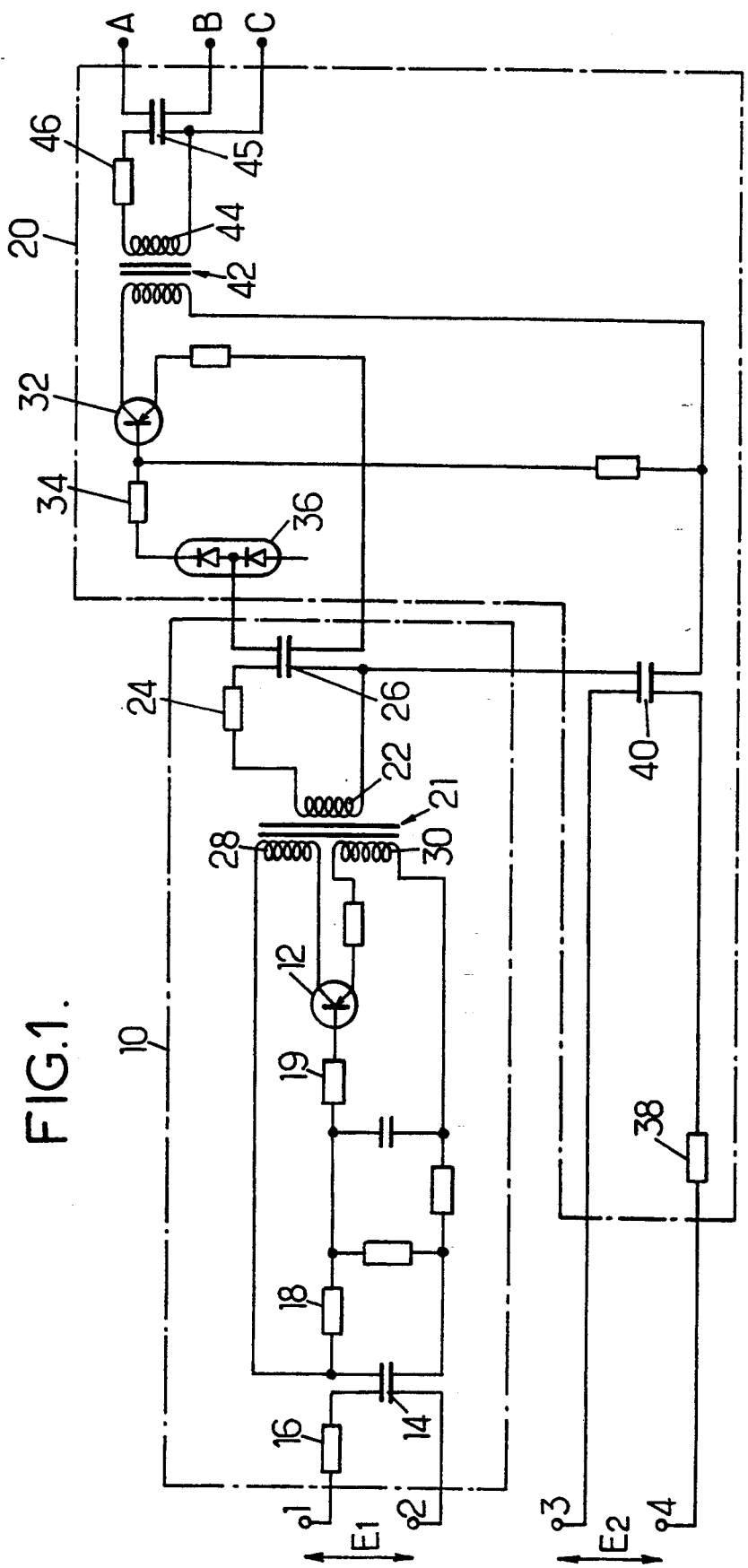
FIG. 1 is a diagram of the upstream portion of the AND circuit.

The threshold oscillator 10 shown by way of example in FIG. 1 includes an input low-pass filter for attenuating possible residual AC signals at the input, comprising a parallel-connected capacitor 14 and resistors 16 and 18 which also adjust the gain as a function of the input voltage. The capacitor 14 has four leads, so as to ensure that the filter is structurally safe. The filter is associated with additional RC networks of conventional design. A series resistor 19 connected immediately ahead of the base of transistor 12 and having a resistance that is very much lower than that of resistors 16 and 18 serves to dampen any possible high frequency instabilities.

The resonant circuit which serves in particular to set the frequency of oscillation is disposed directly at the input of the peak-limiting amplifier 20. This disposition makes it possible to accept a floating power supply since it guarantees very low impedance on the dynamic input of the peak-limiting amplifier 20, even in the event of failure. The resonant circuit is constituted by the secondary winding 22 of the coupling transformer 21, an attenuating input resistor 24, and a capacitor 26. The transformer 21 includes two primary windings 28 and 30 placed respectively in the collector circuit and in the emitter circuit of transistor 12, in such a manner as to adjust the loop gain. The Q-factor of the tuned circuit is low so as to reduce sensitivity to intermittent contacts.

Peak-Limiting Amplifier

The peak-limiting amplifier 20 shown in FIG. 1 uses a circuit having a single transistor connected in common emitter mode so as to obtain high gain. The alternating signal applied to the preamplifier is taken from the terminals of the four-lead capacitor 26, so as to avoid that a break in a lead of the capacitor puts the capacitor out of circuit and causes a high input impedance to appear.

The voltage taken from the terminals of the capacitor 26 is applied to the single transistor 32 of the amplifier 20 via a base resistor 34 having a resistance that is much higher (about 100 times higher) than the resistance of resistor 24, thereby avoiding any danger of Miller effect oscillation with the resonant circuit of the oscillator constituted by elements 22 and 26. A diode 36 is advantagiously inserted in the base bias circuit so as to provide temperature compensation.

On the second input of the AND gate, constituted by terminals 3 and 4, a filter is interposed, comprising a resistor 38 and a four-lead capacitor 40, comparable to the resistor 16 and the capacitor 14 on the first input. The resistance of resistor 38 and the capacitance of capacitor 40 are chosen so as to obtain a short discharge time, thereby reducing sensitivity to intermittent contacts.

The transistor 32 feeds a resonant output circuit connected to the secondary of a coupling transformer 42 so as to enable the second input of the AND circuit to be used in floating mode and to guarantee a safe controlled impedance on the dynamic input of the output amplifier (the term "safe controlled" being understood with the meaning specified above). The resonant circuit includes the secondary winding 44 of the transformer, a 4-lead capacitor 45, and a damping resistor 46. It is therefore comparable to the oscillator circuit. However, again for obtaining safe control, its impedance is relatively low, being about ten times the emitter resistance of transistor 32.

Output Amplifier

The general structure of the amplifier 48 is conventional. The amplifier shown by way of example in FIG. 2 has two transistors 50 and 52. The DC power supply voltage is applied to the inputs 5 and 6 via a filter circuit 54 comparable to that of the oscillator and to that of the peak-limiting amplifier. Power supply is via a 4-lead capacitor 55 so as to be inherently safe. The output amplifier, devoid of bias so as to increase tolerance on the second input of the circuit by creating an additional threshold via the base-emitter junctions of transistors 50 and 52, drives the output rectifiers via a transformer 56.

Figure 2:
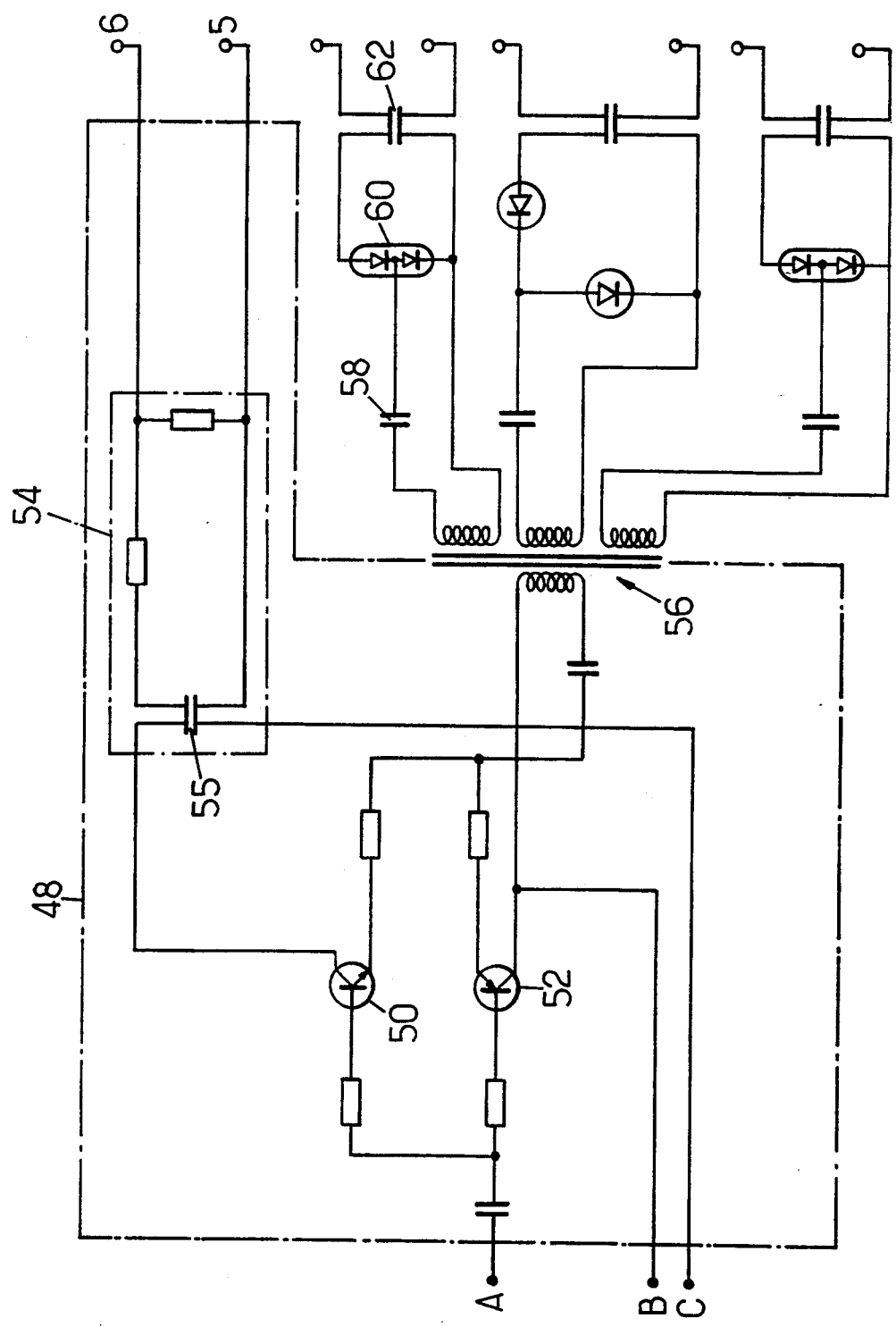
FIG. 2 is a diagram of the downstream portion of the AND circuit, with the portions being interconnected via terminals A, B and C in FIG. 1 and 2.

The gate shown in FIG. 2 includes three output circuits, each associated with a respective secondary winding of the transformer 56. Each rectifier includes a capacitor, e.g. 58, reducing sensitivity to intermittent contacts, together with two diodes 16 that may be connected in a "diode pump" type circuit which doubles voltage. The connection may be made to the output terminals via a 4-lead capacitor 62 for safety purposes.

Figure 3:
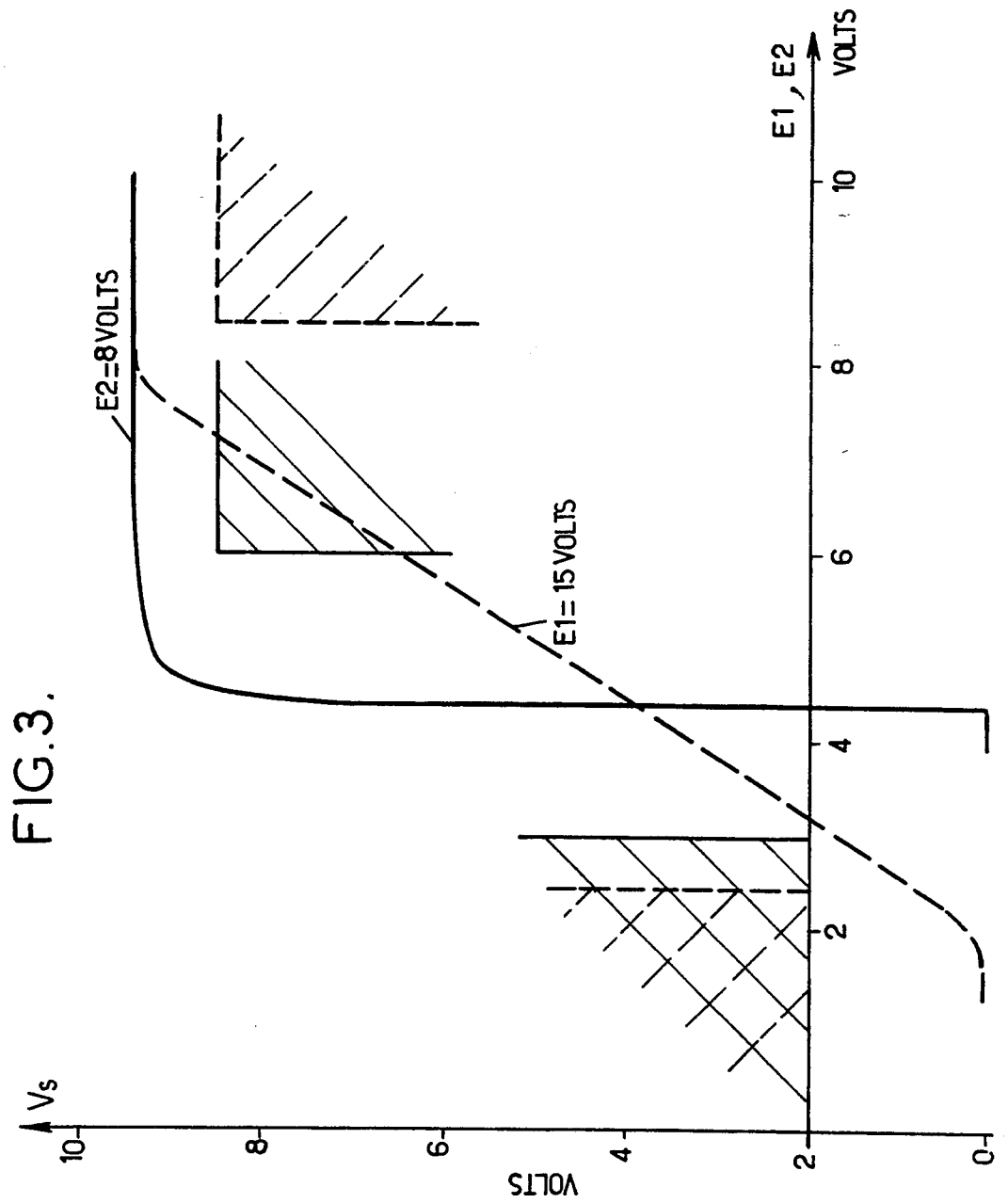
FIG. 3 shows a typical limits to be satisfied by an intrinsically safe AND circuit, together with the response of the circuit shown in FIG. 1 and 2 to input signals applied to the first input (solid line curve) and to the second input (dashed line curve), at a temperature of +25° C. and for the nominal voltage that represents logic 1 on the other input.

By way of example, FIG. 3 shows the response characteristics that can be obtained at 25° C., as compared with the limits conventionally required. The solid line curve shows the variations of the output voltage Vs responsive to the input voltage E1 when the second input is at E2=8 Volts. The dash-line curve shows the response characteristic at the same temperature for a voltage E1 of 15 volts. The circuits retain characteristics that comply with the required limits over a temperature range of −25° C. to +85° C., for a very wide range of loads, and a fan-out of up to 3.

I claim

1. Logic AND circuit having two circuit inputs and comprising, in a cascade arrangement:
   a threshold oscillator having a power supply input connected to a first of said circuit inputs and constructed to deliver an output signal only if a voltage on said first input exceeds a predetermined threshold; and
   a clamping amplifier having an input connected to receive said output signal, constructed to provide an output signal exceeding a given value only when simultaneously the voltage on a power supply input thereof constituting said second circuit input exceeds another predetermined threshold and said output signal is received from said threshold oscillator, said amplifier being designed so as to be unable to oscillate spontaneously,
   wherein said oscillator, of a type using variation of the dynamic impedance of the emitter of a transistor thereof, comprises a single transistor whose emitter and collector circuits contain two primary windings of a transformer whose secondary winding constitutes a tuned circuit in association with a four-lead capacitor and whose base is biased from said first input via a filter cell having a parallel-connected four-lead capacitor, so connected that an input current flows across the plates of the capacitor and wherein the clamping amplifier includes a single transistor connected to said second input via a filter cell having a parallel-connected four-lead capacitor, with one of its emitter and collector circuits containing the primary winding of another transformer whose secondary winding contains a resonant circuit with a parallel-connected four-lead capacitor from whose terminals an alternating output signal is taken.

2. Logic AND circuit according to claim 1, wherein the single transistor of said clamping amplifier is a bipolar transistor connected in common emitter mode.

3. Logic AND circuit according to claim 1, further comprising an impedance lowering output amplifier having a gain close to unity connected to receive said output signal of said clamping amplifier.

4. Logic AND circuit according to claim 3, wherein said output amplifier is connected to drive at least one rectifier haing a four-lead filtering capacitor.

5. Logic AND circuit according to claim 4, wherein said rectifier includes a diode pump circuit having two diodes for voltage doubling.

* * * * *